US007584820B2

(12) United States Patent
Parker et al.

(10) Patent No.: US 7,584,820 B2
(45) Date of Patent: Sep. 8, 2009

(54) ACOUSTIC RADIATING

(75) Inventors: Robert Preston Parker, Westborough, MA (US); Dewey Potter, Holliston, MA (US)

(73) Assignee: Bose Corporation, Framingham, MA (US)

( * ) Notice: Subject to any disclaimer, the term of this patent is extended or adjusted under 35 U.S.C. 154(b) by 154 days.

(21) Appl. No.: 10/914,497

(22) Filed: Aug. 9, 2004

(65) Prior Publication Data

US 2005/0205349 A1 Sep. 22, 2005

Related U.S. Application Data

(63) Continuation-in-part of application No. 10/805,440, filed on Mar. 19, 2004.

(51) Int. Cl.
*H05K 5/00* (2006.01)

(52) U.S. Cl. ....................... 181/155; 181/148; 181/199; 181/196

(58) Field of Classification Search ................. 181/148, 181/155, 196, 199, 156, 145, 296, 197; 381/337, 381/338, 339, 352, 160, 349, 350, 351, 302, 381/86, 389, 342
See application file for complete search history.

(56) References Cited

U.S. PATENT DOCUMENTS

| | | | | |
|---|---|---|---|---|
| 1,952,514 | A | | 3/1934 | Selby |
| 2,812,032 | A | | 11/1957 | Kock |
| 2,912,061 | A | | 11/1959 | Kock |
| 3,122,215 | A | | 2/1964 | Sutton |
| 3,234,559 | A | | 2/1966 | Johann |
| 3,977,006 | A | | 8/1976 | Miersch |
| 4,020,284 | A | * | 4/1977 | Phillips ......................... 381/2 |
| 4,224,469 | A | | 9/1980 | Karson |
| 4,628,528 | A | | 12/1986 | Bose et al. |
| 4,733,749 | A | | 3/1988 | Newman et al. |
| 4,887,690 | A | * | 12/1989 | Patel .......................... 181/150 |
| 4,903,300 | A | | 2/1990 | Polk |
| 4,924,962 | A | | 5/1990 | Terai et al. |
| 4,930,596 | A | | 6/1990 | Saiki et al. |
| 4,942,939 | A | * | 7/1990 | Harrison ..................... 181/156 |

(Continued)

FOREIGN PATENT DOCUMENTS

DE 2509369 10/1976

(Continued)

OTHER PUBLICATIONS

E.V. Carlson "Soothing the Hearing Aid Frequency Response", *Journal of the Audio Engineering Society*, vol. 22, No. 6, pp. 426-429. (1974).

(Continued)

*Primary Examiner*—Jeffrey Donels
*Assistant Examiner*—Forrest M Phillips
(74) *Attorney, Agent, or Firm*—Fish & Richardson P.C.

(57) ABSTRACT

An apparatus includes an acoustic device comprising a waveguide having a sound opening at one end facing a space, an audio source, an acoustic driver at another end of the waveguide, the acoustic driver facing a listening area, and structure supporting the acoustic device, the audio source, and the acoustic driver, as an integrated audio system, the acoustic driver and the opening in the waveguide facing in substantially different directions from the structure.

29 Claims, 17 Drawing Sheets

U.S. PATENT DOCUMENTS

| | | | |
|---|---|---|---|
| 4,944,362 | A | 7/1990 | Motsinger et al. |
| 5,012,890 | A | 5/1991 | Nagi et al. |
| 5,170,435 | A * | 12/1992 | Rosen et al. .................. 381/86 |
| 5,193,118 | A | 3/1993 | Latham-Brown et al. |
| 5,197,103 | A * | 3/1993 | Hayakawa .................. 381/349 |
| 5,369,796 | A * | 11/1994 | Kung ......................... 455/344 |
| 5,479,520 | A | 12/1995 | Nieuwendijk et al. |
| 5,637,840 | A * | 6/1997 | Kim ........................... 181/152 |
| 5,659,155 | A | 8/1997 | Porzilli |
| 5,721,401 | A * | 2/1998 | Sim ........................... 181/148 |
| 5,796,854 | A | 8/1998 | Markow |
| 5,821,471 | A * | 10/1998 | McCuller .................... 181/156 |
| 5,889,875 | A | 3/1999 | Caron et al. |
| 5,920,633 | A | 7/1999 | Yang |
| 6,141,428 | A * | 10/2000 | Narus ......................... 381/338 |
| 6,278,789 | B1 | 8/2001 | Potter |
| 6,363,157 | B1 | 3/2002 | Chick |
| 6,411,720 | B1 * | 6/2002 | Pritchard .................... 381/348 |
| 6,634,455 | B1 | 10/2003 | Yang |
| 6,648,098 | B2 | 11/2003 | Nichols |
| 6,668,969 | B2 | 12/2003 | Meyer et al. |
| 2002/0085731 | A1 | 7/2002 | Aylward |
| 2002/0150270 | A1 | 10/2002 | Werner |
| 2004/0005069 | A1 | 1/2004 | Buck |
| 2004/0105559 | A1 | 6/2004 | Aylward et al. |
| 2005/0089184 | A1 * | 4/2005 | Wang ......................... 381/345 |
| 2005/0094837 | A1 | 5/2005 | Parker |
| 2005/0135642 | A1 * | 6/2005 | Dry ............................ 381/302 |
| 2005/0195987 | A1 | 9/2005 | Kim |
| 2005/0205348 | A1 | 9/2005 | Parker et al. |
| 2005/0205349 | A1 | 9/2005 | Parker et al. |

FOREIGN PATENT DOCUMENTS

| | | |
|---|---|---|
| EP | 0453230 | 10/1991 |
| EP | 0624045 | 11/1994 |
| EP | 1221823 | 7/2002 |
| EP | 1 571 873 | 7/2005 |
| EP | 1577880 | 9/2005 |
| EP | 1585108 | 10/2005 |
| GB | 2391739 | 8/2002 |
| JP | S57-22477 | 5/1982 |
| JP | S61-20490 | 1/1986 |
| JP | 04150195 | 5/1992 |
| JP | 2005-269633 | 9/2005 |
| JP | 2005-269634 | 9/2005 |
| WO | WO 91/19406 | 12/1991 |

OTHER PUBLICATIONS

Official office action issued Mar. 21, 2007 in U.S. Appl. No. 10/805,440, entitled Acoustic Waveguiding, filed Mar. 19, 2004.
EP Search Report in Application 05101864.6 dated Sep. 29, 2006.
EP Search Report in Application 05101863 dated Sep. 19, 2006.
Office Action in U.S. Appl. No. 10/805,440 dated Mar. 21, 2007.
Office Action in U.S. Appl. No. 10/805,440 dated Dec. 10, 2007.
Office Action dated Dec. 5, 2008 in corresponding Chinese application No. 200510054270.1.
Response to Examination Report from European Application No. 04300106.4-1224 dated Feb. 10, 2009.

* cited by examiner

ACOUSTIC RADIATING

This application is a continuation-in-part of U.S. patent application Ser. No. 10/805,440, filed Mar. 19, 2004, and incorporated here in its entirety by reference.

BACKGROUND

This description relates to acoustic radiating.

Acoustic radiating has been done using waveguides in products such as the commercially available Bose® WAVE® radio, WAVE® Radio/CD and ACOUSTIC WAVE® (Bose Corporation, Framingham, Mass.) music systems. Acoustic radiating has also been done using so-called acoustic ports on speaker cabinets. In some examples, the acoustic port openings are on the front of the speaker cabinet and face the listening area. In other examples, the port openings are on the rear of the cabinet and face away from the listening area. Port openings that face away from the listening area have been used in radios. Some horns have associated waveguides that face away from the listening area.

SUMMARY

In general, in one aspect, an apparatus includes an acoustic device comprising a waveguide having a sound opening at one end facing a space, an audio source, an acoustic driver at another end of the waveguide, the acoustic driver facing a listening area, and structure supporting the acoustic device, the audio source, and the acoustic driver, as an integrated audio system, the acoustic driver and the opening in the waveguide facing in substantially different directions from the structure.

Implementations may include one or more of the following features. The acoustic driver and the sound opening of the waveguide face in substantially opposite directions. The sound opening of the waveguide does not face the listening area. The waveguide comprises a trunk and branches coupled to the trunk. Each of the branches has a corresponding acoustic driver. The sound radiated by the acoustic device has a different frequency spectrum from the sound radiated from the waveguide. The integrated audio system comprises a radio.

In general, in another aspect, an apparatus includes an audio source, an acoustic driver supported by a housing and facing a listening area, an acoustic device comprising a waveguide or port having one end driven by the acoustic driver and a second, open end, the housing supporting the audio source, the acoustic driver, and the acoustic device in an integrated audio system, the housing having an aperture facing in a direction different from the listening area, the aperture comprising two or more openings, the second, open end of the waveguide being separated by a space from the aperture of the housing and oriented with respect to the aperture so that sound radiated from the open end passes through the aperture.

Implementations may include one or more of the following features. The aperture comprises a grille. The aperture comprises slots in the housing. The acoustic device comprises a folded waveguide. The space is at least large enough to substantially reduce distortion caused by the aperture of the housing in sound radiated from the acoustic device.

In general, in another aspect, an apparatus includes an audio source, an acoustic driver facing a listening area, a housing supporting the audio source and the acoustic driver in an integrated audio system, the housing comprising an aperture comprising two or more openings, an acoustic device comprising a waveguide having one end driven by the acoustic driver and a second, open end, the second, open end of the waveguide being separated by a space from the aperture of the housing and oriented with respect to the aperture so that sound radiated from the open end passes through the aperture.

In some implementations of the invention the second opening at the end of the waveguide is flared.

Other aspects may include methods of making and using the apparatus, systems that include the apparatus, and components of the apparatus.

Other advantages and features will become apparent from the following description and from the claims.

DESCRIPTION

Figure 5:
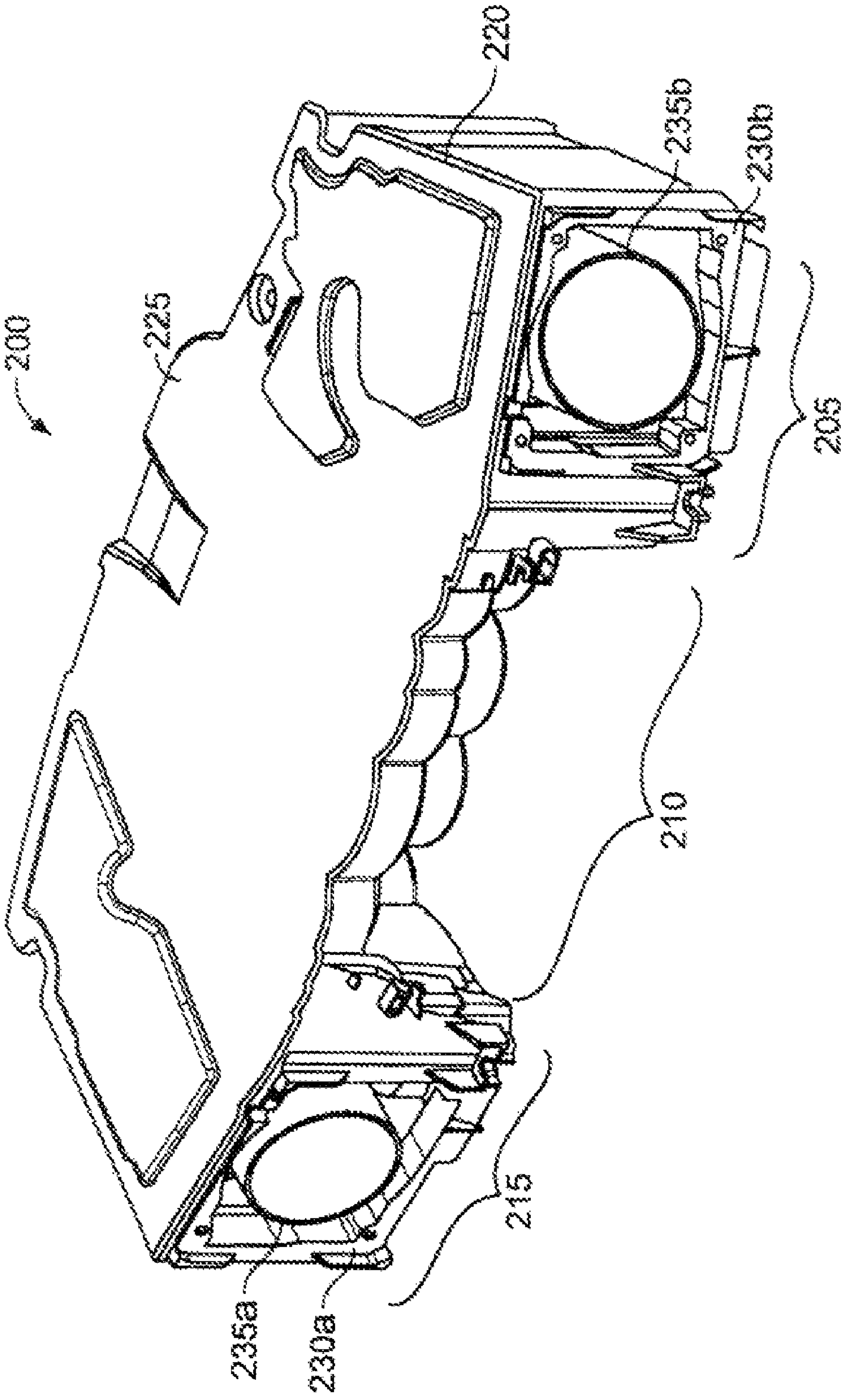
FIG. 5 is a perspective view of an exemplary waveguide system.
Figure 7A:
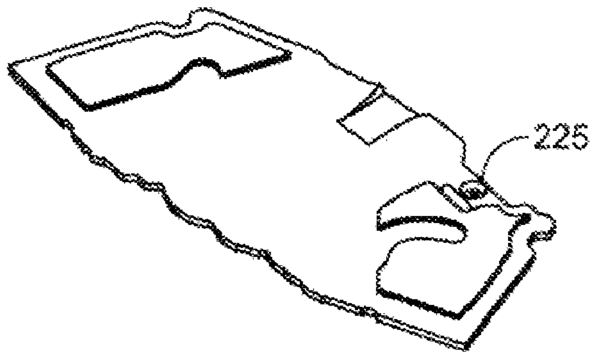
Figure 7B:
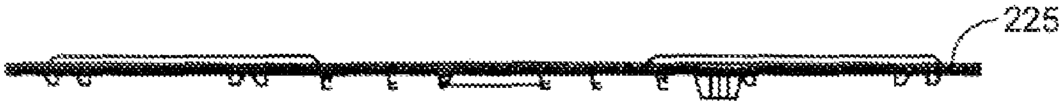
Figure 7C:
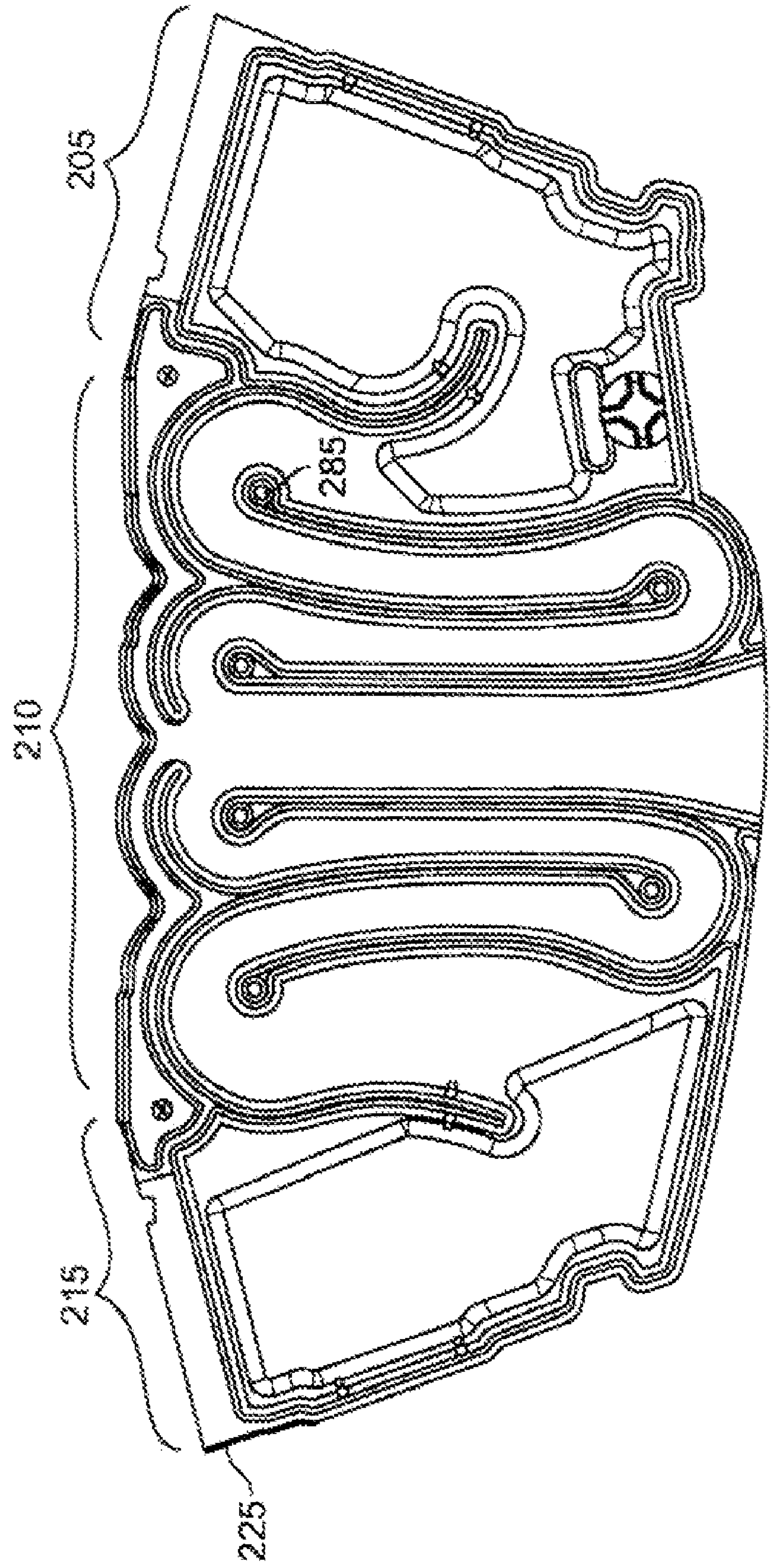

FIGS. 7A, 7B, and 7C are three-dimensional, side and bottom views, respectively, of a cover section to the apparatus of FIG. 5.

Figure 8A:
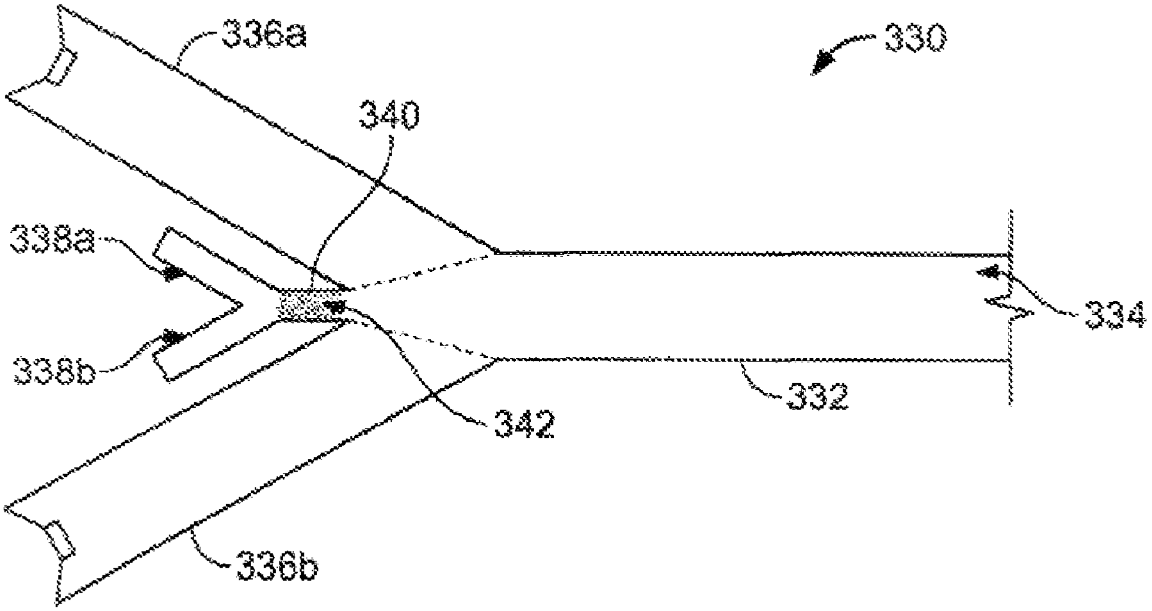
Figure 8B:
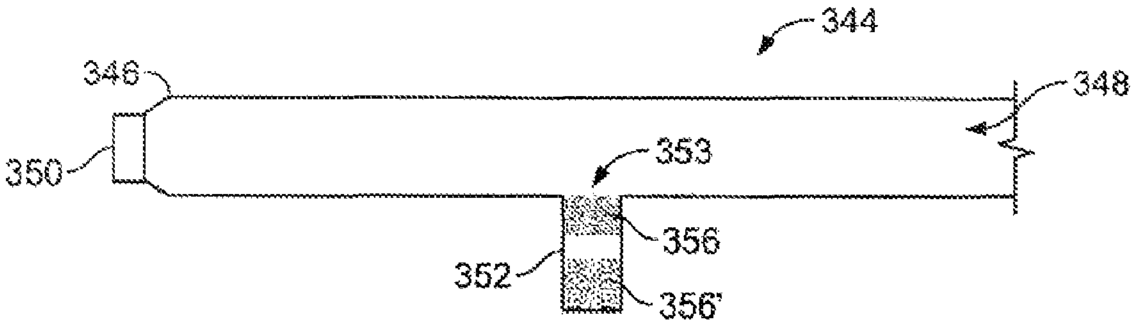
Figure 8C:
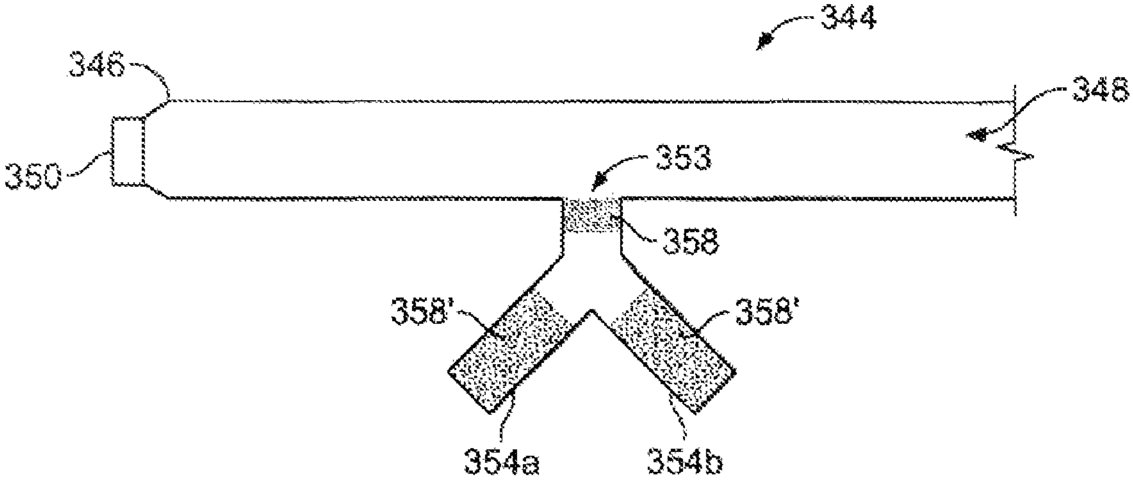

FIGS. 8A, 8B and 8C are schematic representations of waveguides.

Figure 9:
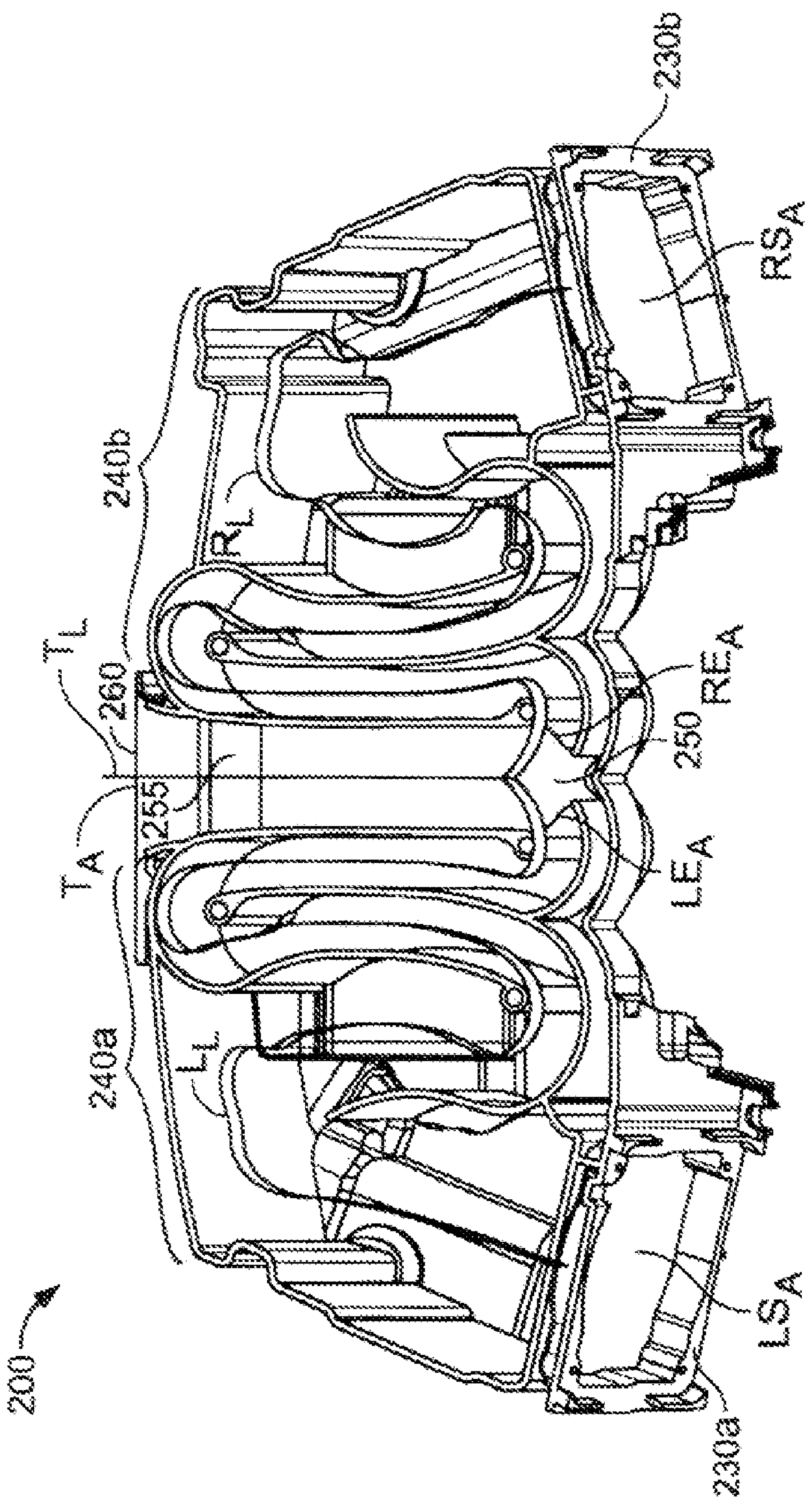

FIG. 9 is a perspective view of a waveguide with the cover section removed.

Figure 10A:
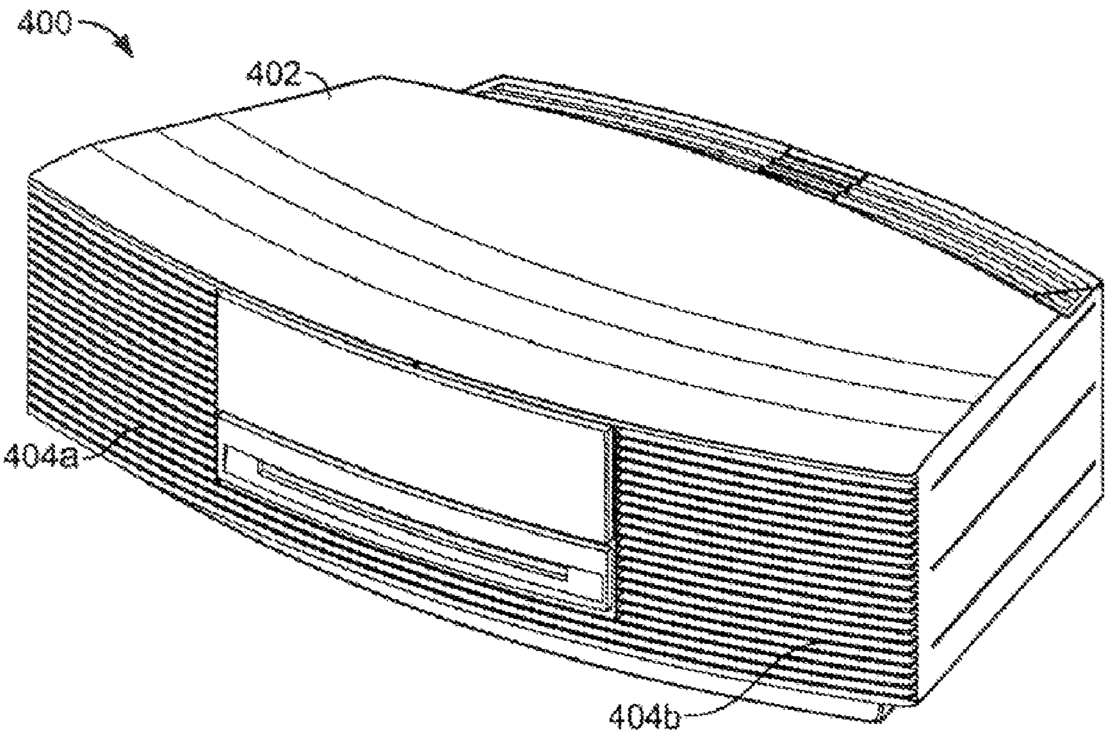
Figure 10B:
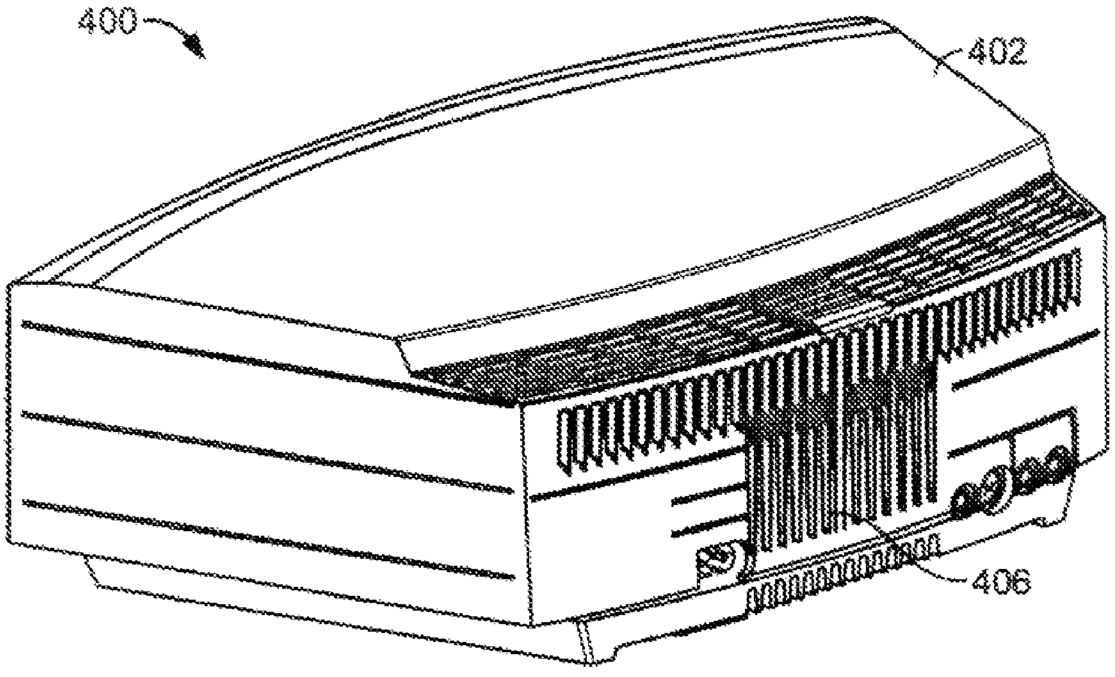

FIGS. 10A and 10B are front and rear three-dimensional views of a radio including an exemplary waveguide.

Figure 11:
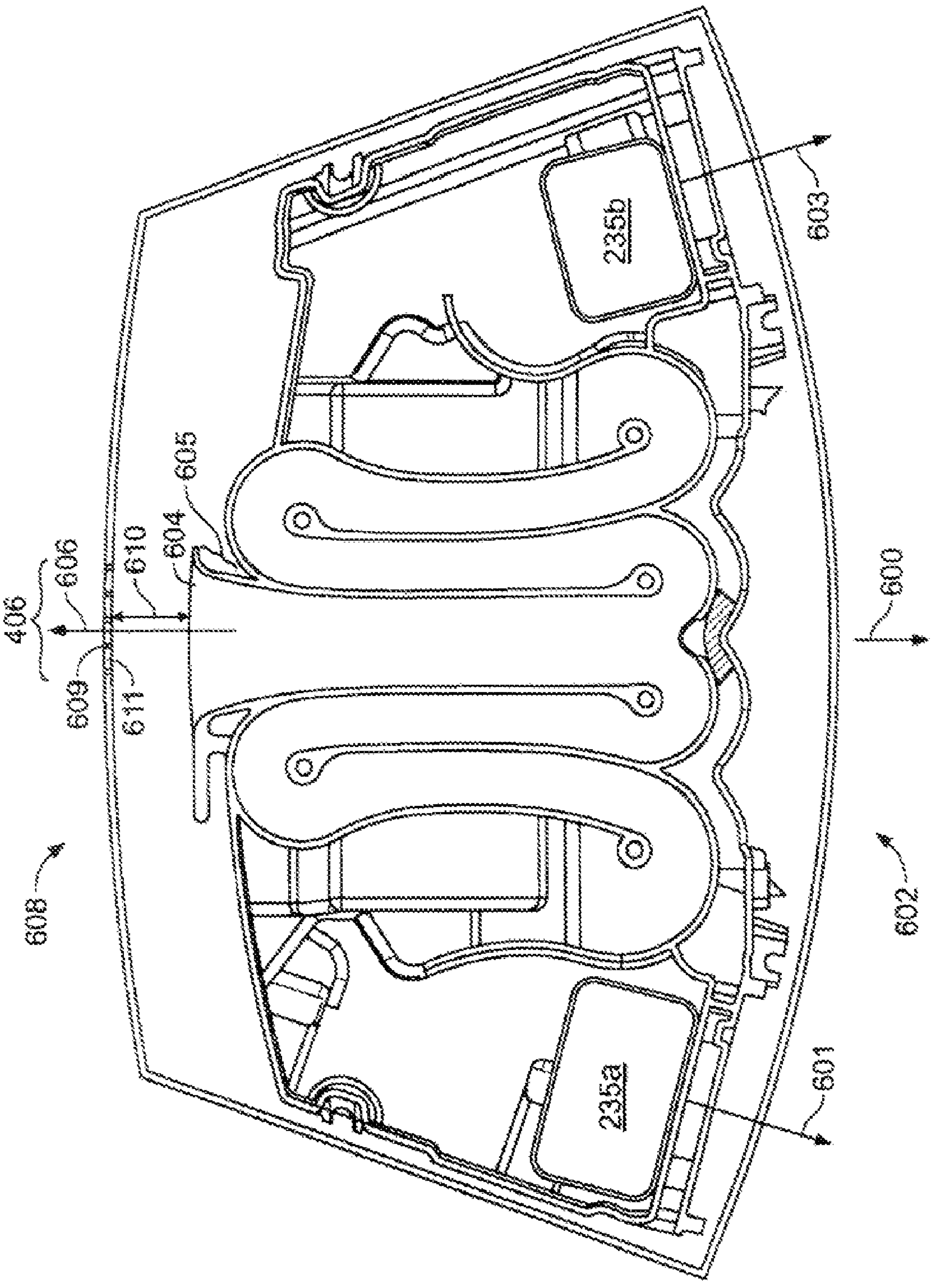

FIG. 11 is a schematic top view of portions of a radio.

Figure 12:
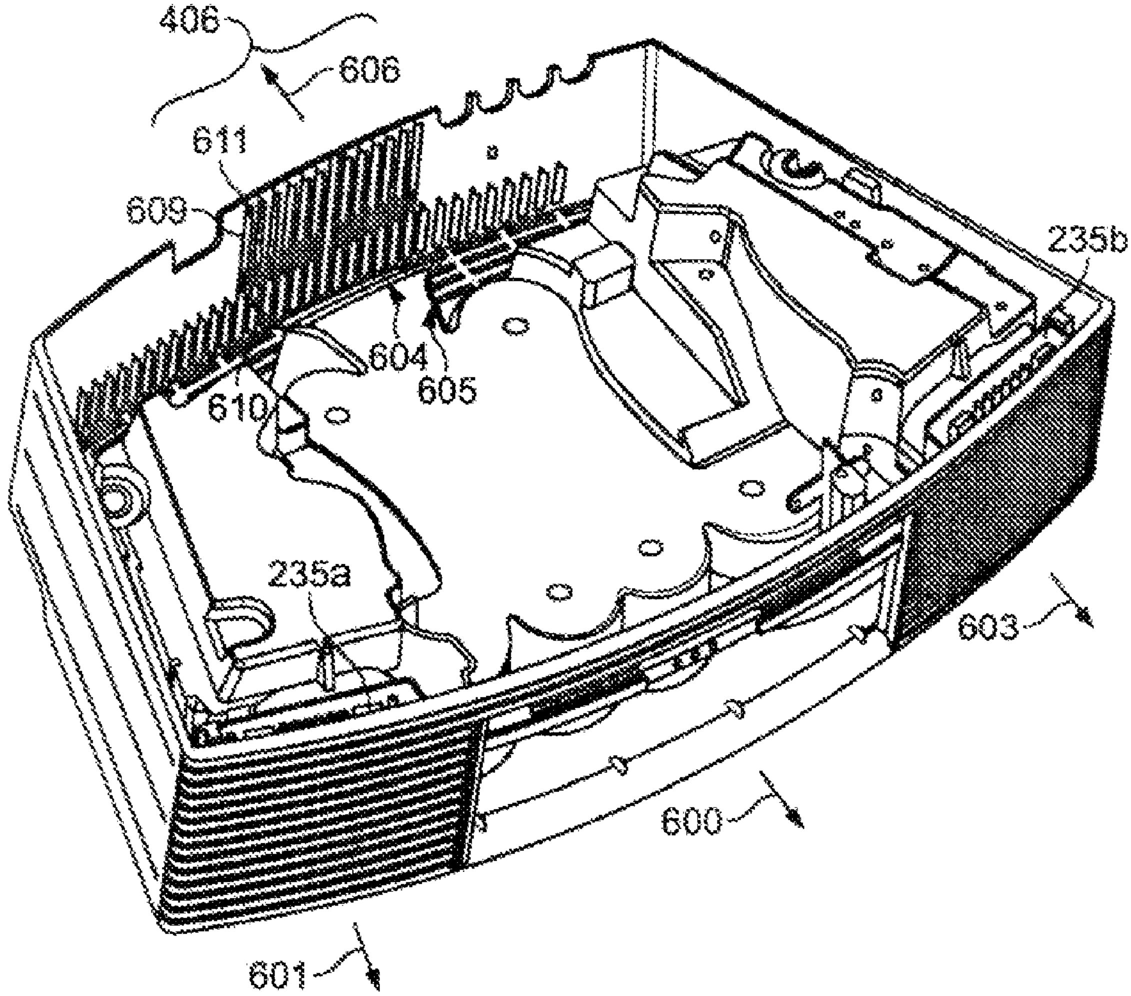

FIG. 12 is a top perspective view of portions of a radio.

Figure 1:
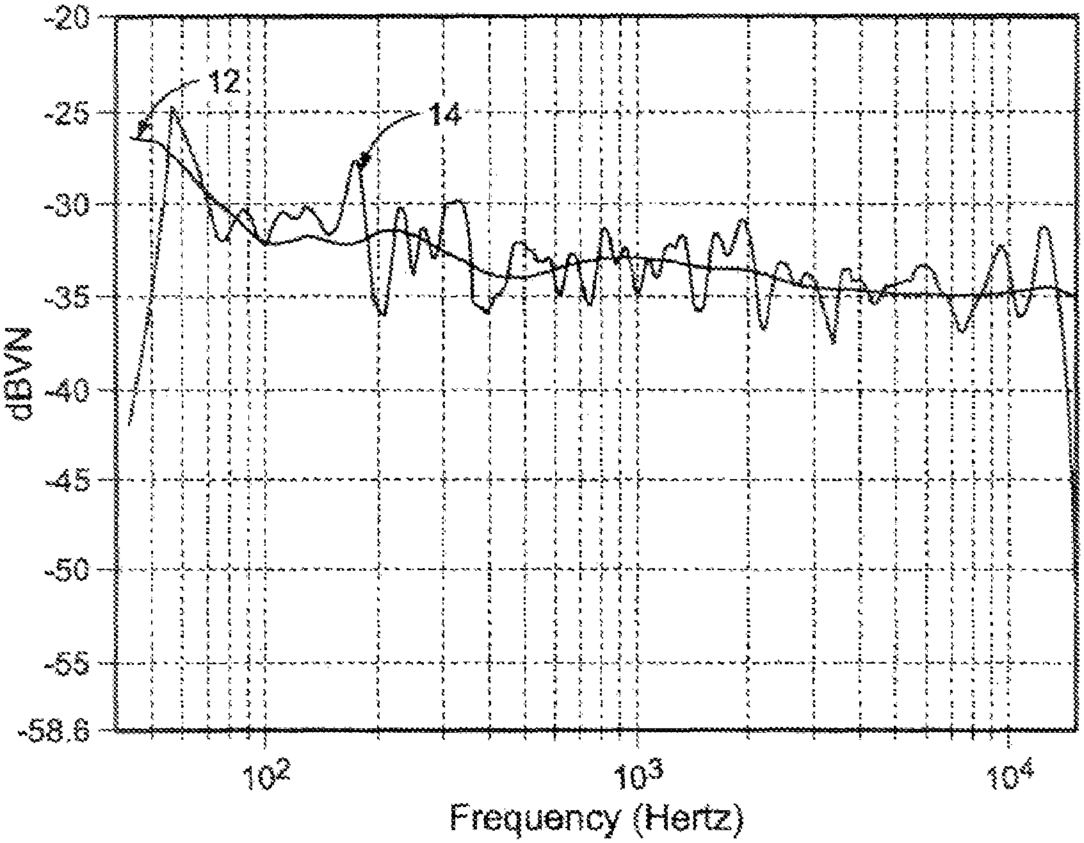
FIG. 1 is a graphical representation of a target and measured room frequency response.

For the embodiments discussed here, a "waveguide" is defined to have certain features. Specifically, waveguide as used herein refers to an acoustic enclosure having a length which is related to the lowest frequency of operation of the waveguide, and which is adapted to be coupled to an acoustic energy source to cause an acoustic wave to propagate along the length of the waveguide. The waveguide also includes one or more waveguide exits or openings with a cross-sectional area, that face free air and allow energy coupled into the waveguide by the acoustic energy source to be radiated to free air through the waveguide exit. Exemplary waveguides can be characterized by specific relationship between the cross-sectional area of the waveguide exit and the wavelength of sound at the low frequency cutoff of the waveguide, where the low frequency cutoff can be defined as the −3 dB frequency. The −3 dB frequency is typically slightly lower in frequency than the lowest frequency standing wave that can be supported by the waveguide, which is typically the frequency where the longest dimension of the waveguide is one quarter of a wavelength. FIG. 1 graphically depicts an exemplary target frequency response 12 and a measured room frequency response 14 of a waveguide according to one example. Embodiments of the invention have the following characteristic:

$$(\sqrt{A})/\lambda \leqq 1/15(0.067)$$

where A is the cross-sectional area of the waveguide exit and λ is the wavelength of the −3 dB frequency of the waveguide system. In one exemplary embodiment, the low frequency cutoff is 55 Hz and corresponding wavelength λ is 20.6 ft. The cross-sectional area of the waveguide exit A is 2.5 sq. in (0.0174 sq ft):

$$(\sqrt{A})/\lambda=(0.0174)^{1/2}/20.6\text{ ft}=0.2\text{ ft}/20.6\text{ ft}=0.0064<1/15(0.067)$$

Figure 2:
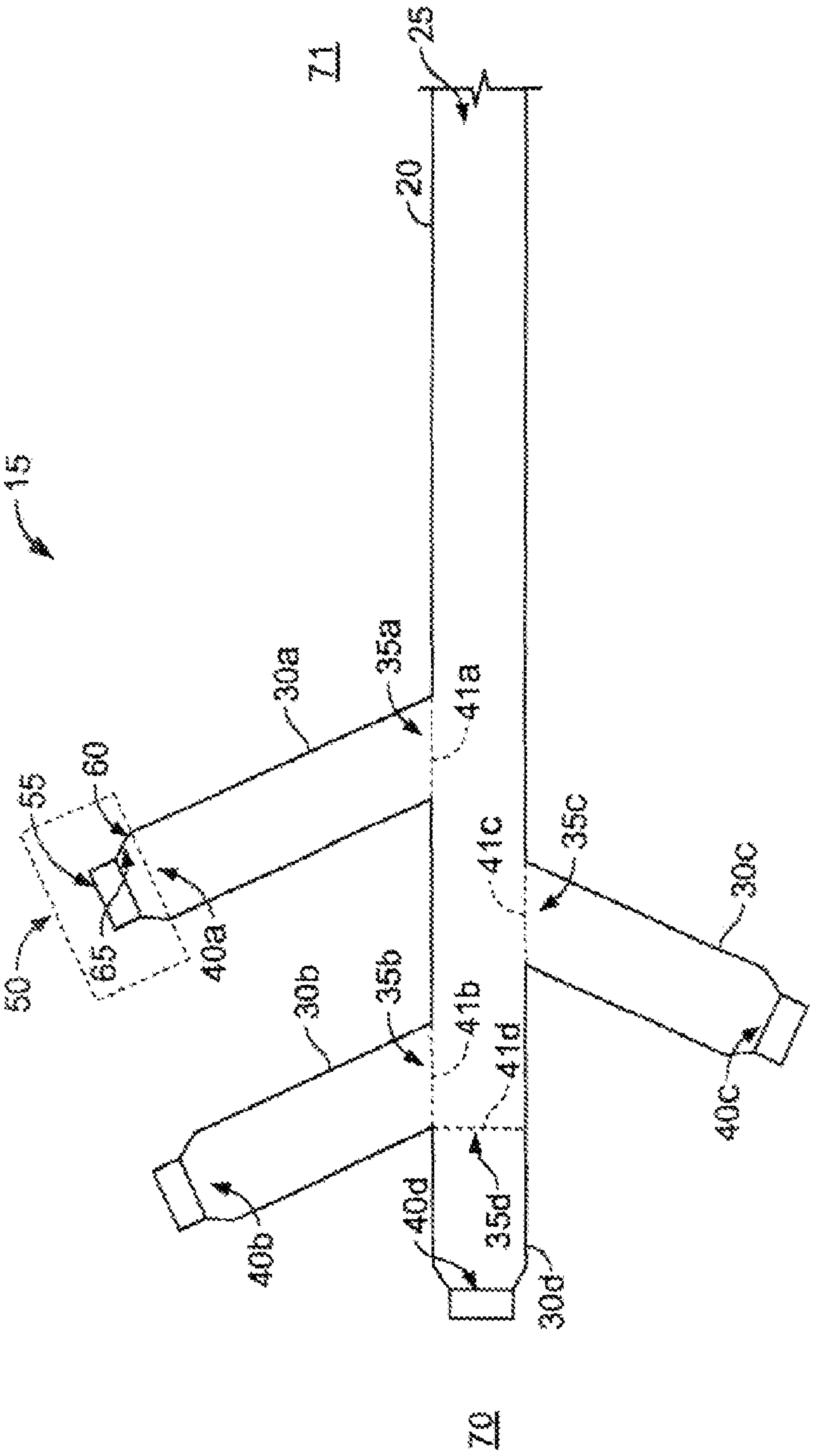
FIG. 2 is a schematic cross-sectional view of a waveguide system.

As seen in FIG. 2, an electroacoustical waveguide system 15 includes a hollow trunk acoustic waveguide section 20, which has a single open end 25, and hollow branch acoustic waveguide sections 30*a*, 30*b*, 30*c* and 30*d*. Each of the branch sections, such as 30*a*, has an open end 35*a* and a terminal end 40*a*. The open ends of the branch sections are coupled to the trunk section 20 at locations 41*a*, 41*b*, 41*c* and 41*d*. The hollow trunk extends from its open end 25 to the locations 41. One or more of the terminal ends 40 of the branch sections (such as 40*a*) are acoustically coupled to an acoustic energy source 50.

Each acoustic energy source can include an acoustic driver 55 that has a radiating surface with an outer side 60 facing free air and an inner side 65 facing the trunk section 20. Although the driver 55 is shown positioned outside the branch waveguide sections, the driver can also be located inside one or more of the branch sections. The acoustic energy sources 50 are connected to an audio source (not shown) through a power amplifier, for example, a radio, a CD or DVD player, or a microphone. The branch sections can be arranged so that the radiating surfaces facing free air are generally aimed toward a designated listening area 70. Sound produced by the acoustic drivers is projected through the air into the listening area 70 and through the waveguide sections into the area 71 at the open end 25 of the trunk section 20. Any number of (or none) branch section drivers could be coupled to face free air. Furthermore, there may be back enclosures coupled to the drivers (not shown). Although areas 70 and 71 are shown apart, these may be essentially the same area or areas not spaced that far apart as shown (e.g., about a foot or two) to keep the waveguide and product in which the waveguide is implemented compact (for example, the waveguide can be folded over on itself to accomplish this).

The physical dimensions and orientations of the branch sections can be modified to suit specific acoustical requirements. For example, the lengths of the respective branch sections can be the same or different. The cross-sectional areas and shapes along each of the branch and trunk sections and between sections can be the same or different. The coupling locations 41*a* through 41*d* for the waveguide sections may be at a common position or at different positions along the trunk, for example, as shown in FIG. 2. The spatial separation of branch sections allows for spatial distribution of different program information that is fed into the listening area 70 from acoustic energy sources 50.

Additional information about acoustic waveguides is set forth in Bose U.S. Pat. Nos. 4,628,528 and 6,278,789 and patent application Ser. No. 10/699,304, filed Oct. 31, 2003, which are incorporated here by reference.

Figure 3:
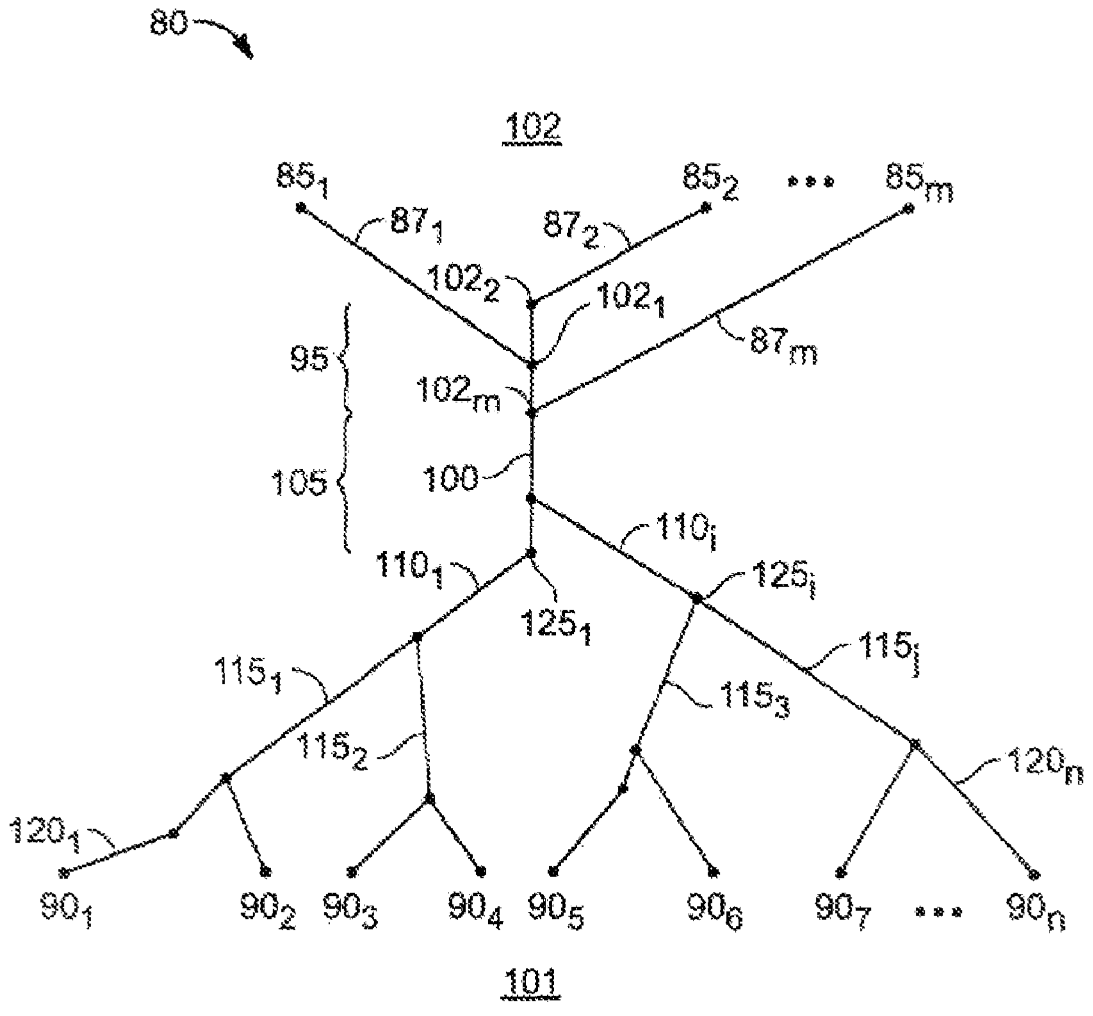
FIG. 3 is a schematic representation of a waveguide system.

As shown in FIG. 3, an electroacoustical waveguide 80 has a general tree structure and includes open end root nodes $\mathbf{85}_1$, $\mathbf{85}_2$, . . . $\mathbf{85}_m$ and terminal end leaf nodes $\mathbf{90}_1$, $\mathbf{90}_2$, . . . $\mathbf{90}_n$. The root nodes are connected along a first portion 95 of a trunk section 100 at root nodes $\mathbf{102}_1$, . . . $\mathbf{102}_m$ by leaf branch sections $\mathbf{87}_1$, $\mathbf{87}_2$, . . . $\mathbf{87}_m$. The end leaf notes $\mathbf{90}_1$, $\mathbf{90}_2$, . . . $\mathbf{90}_n$ are connected to a second portion 105 of the trunk section 100 by a branching network of primary, secondary, and tertiary internal waveguide sections $\mathbf{110}_1$, . . . $\mathbf{110}_i$, $\mathbf{115}_1$, . . . $\mathbf{115}_j$, and $\mathbf{120}_1$, . . . $\mathbf{120}_n$, respectively, and internal nodes, such as $\mathbf{125}_1$, . . . $\mathbf{125}_i$. Each of the leaf nodes, $\mathbf{90}_1$, $\mathbf{90}_2$, . . . $\mathbf{90}_n$, can be coupled to an acoustic energy source that has an acoustic driver including radiating surfaces, as shown in FIG. 2.

The root nodes are spatially separated from each other. The leaf nodes are spatially separated from each other. Different program information may be fed into the different leaf nodes to produce a spatial distribution of program information. For example, program information having similar or the same low frequency components but with different high frequency components can be fed into the leaf nodes. An outer side of the radiating surfaces of the acoustic drivers of the leaf nodes face a designated listening area 101 and an inner side face into the area 102.

When program information is fed into acoustic sources which drive the leaf nodes 90, the leaf nodes, along with the internal sections 110, 115, 120, and the internal nodes 125, are comparable to the branch sections 30 of FIG. 2. As that program information can merge and be delivered to the root nodes 85, the root nodes, along with the leaf branch section 87 and the trunk section 100 are comparable to the hollow trunk 20 of FIG. 2. Although particular combinations of trunks and branch sections are shown in FIGS. 2 and 3, a wide variety of other combinations and configurations of trunk and branch sections are contemplated in an exemplary waveguide.

Figure 4:
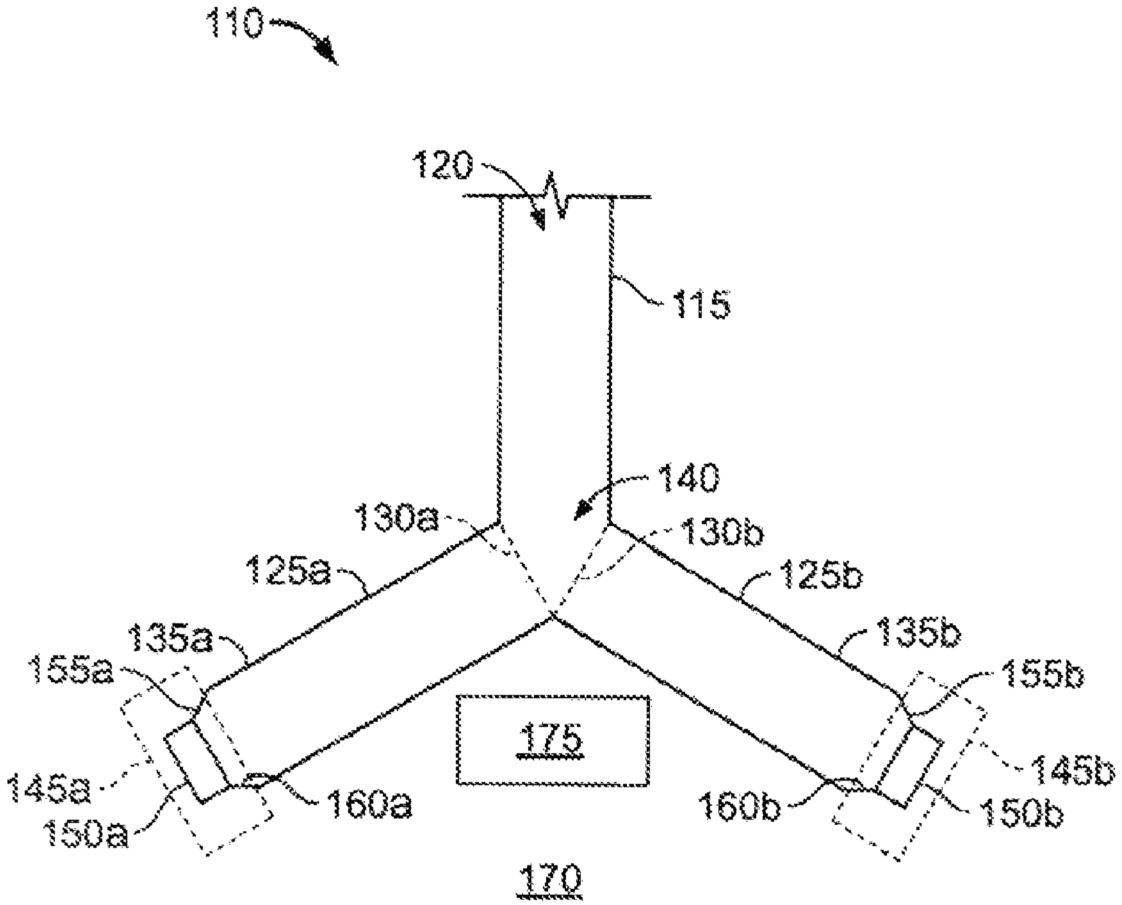
FIG. 4 is a schematic cross-sectional view of a waveguide system.

In the example shown in FIG. 4, an electroacoustical waveguide system 110 includes a trunk section 115 that has a single open end 120 and two branch sections 125*a*, 125*b* extending from the other end of the trunk section. The two branch sections have open ends 130*a* and 130*b* and terminal ends 135*a* and 135*b*. The open ends of the two branch sections are coupled to the trunk section 20 at a substantially common location 140. The two branch sections are acoustically coupled to acoustic energy sources 145*a* and 145*b* located at the terminal ends 135*a* and 135*b*. The acoustic energy sources can each include acoustic drivers 150*a* and 150*b*. Each of the acoustic drivers also has a radiating surface on a back side 155*a*, 155*b* of the acoustic driver, facing free air, and a front side 160*a*, 160*b* of the acoustic driver that is generally oriented toward the trunk section 115. It should be noted that the driver motor 150*a*, 150*b* can be located inside the branch sections 125*a*, 125*b*, rather than the outside orientation as shown, and the front side 160*a*, 160*b* will face free air.

Separate program information can be fed into each branch section, which may be highly correlated or uncorrelated, or may be highly correlated just over a given frequency ranges, such at low frequency range, for example.

A wide variety of implementations of the arrangement in FIG. 4 are possible. In one example, shown in FIG. 5, which is suitable for use in a table radio/CD player, a waveguide 200 has a right portion 205, a middle portion 210, and a left portion 215. The waveguide is a rigid structure formed by an injection molding process using a synthetic resin, such as LUSTRAN® 448 (Bayer Corporation, Elkhart, Ind.), for example. As shown also in FIGS. 6A, 6B, and 6C, The waveguide includes a main body 220, depicted in FIGS. 6A through 6E and a cover section 225, depicted in FIGS. 7A through 7C, which are molded separately and then bonded together.

Referring collectively to FIGS. 6A through 6E and 7A and 7C, the waveguide includes left and right frames 230*a*, 230*b* located in the left and right portions of the waveguide and contain left and right acoustic drivers 235*a*, 235*b* (shown schematically). The drivers each include a radiating surface (not shown) with a first side facing the free air and a second side, opposite the first, facing into the waveguide.

FIGS. 6A through 6E show detailed views of a waveguide trunk section 255 and left and right branch sections 240*a* and 240*b*. Each branch section is a folded continuous tube defining an interior passage and extending from one of the left and right frames containing the drivers at either end of the waveguide to a branch junction 250. The trunk section 255 extends from the branch junction to a single trunk opening 260 having a flared end. Each of the folds defines subsections within each branch section. Each subsection is bounded by baffles or panels extending from the front to the rear of the waveguide. The waveguide housing can also support components such as a CD player, AM antenna, and power supply, for example. The acoustic waveguide system as shown may further include an electronic device (not shown) which uses acoustic energy sources to provide program information to the branch sections.

The first left and right subsections 265*a*, 265*b*, respectively, are partially formed by the outside surfaces (facing the drivers) of tapered first panels 270*a*, 270*b* adjacent the drivers 235*a*, 235*b* and extend to the second subsections 275*a*, 275*b*. The second subsections are formed by the inside surfaces (facing the trunk section 255) of the tapered first panels 270*a*, 270*b* and an outside surface of second panels 280*a*, 280*b* and extend to the third subsections 290*a*, 290*b*. Generally, each of the panels is a curved vertical surface extending from the front or back of the waveguide and includes a free edge. A contoured post 285 is formed at each free edge to reduce losses and turbulence of the acoustic pressure waves. The third subsections 290*a*, 290*b* are formed by the inside surfaces of the second panels and the outside surface of third panels 295*a*, 295*b* and extend to the fourth subsections 300*a*, 300*b*. The fourth subsections are formed by the inside surfaces of the third panels and the outside surface of the trunk section walls 305*a*, 305*b* and extend from the third subsections to connect with the trunk section 255 at the branch junction 250.

The cross-sectional area of each of the branch sections continuously decreases along a path from the left and right frames to the branch junction 250. The first and second subsections are relatively large and more tapered compared with the third and fourth subsections and the common trunk section. Progressing from the second subsection to the third and fourth subsection, the cross-sectional area and degree of taper of the adjacent panels decrease as the height of the subsections along the middle portion 210 decreases. The total volume and cross-sectional area profiles of the left and right branch sections are similar. However, the left and right sections are not completely symmetrical because of the need to accommodate the packaging of differently-sized electronic components within the waveguide 200. For example, an AM antenna (not shown) is located in the left portion and a power supply/transformer (not shown) is located in the right portion.

Figure 6A:
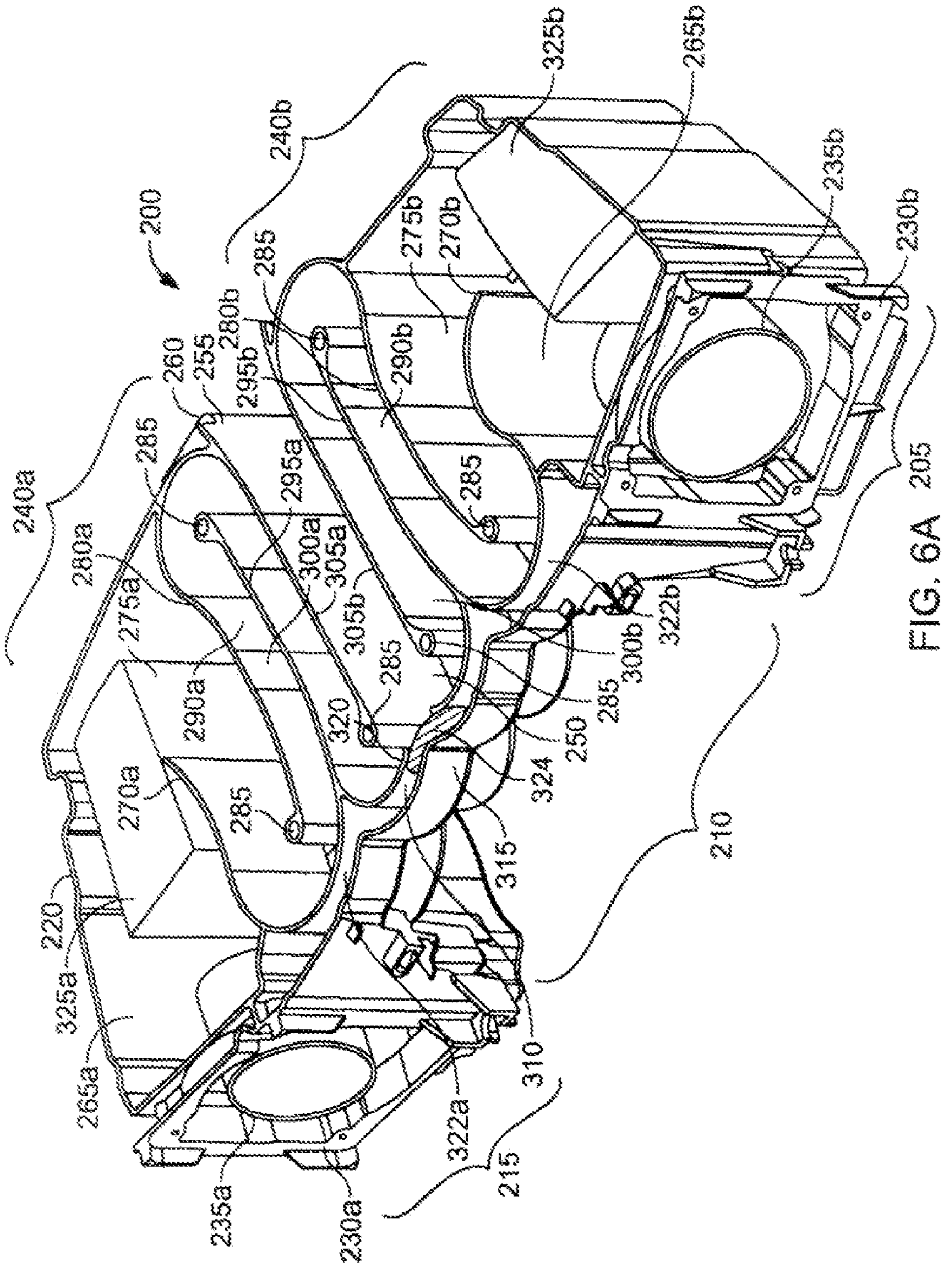
FIGS. 6A through 6E are three-dimensional, top, front, bottom, and broken away end views, respectively, of a waveguide with a cover section removed.
Figure 6B:
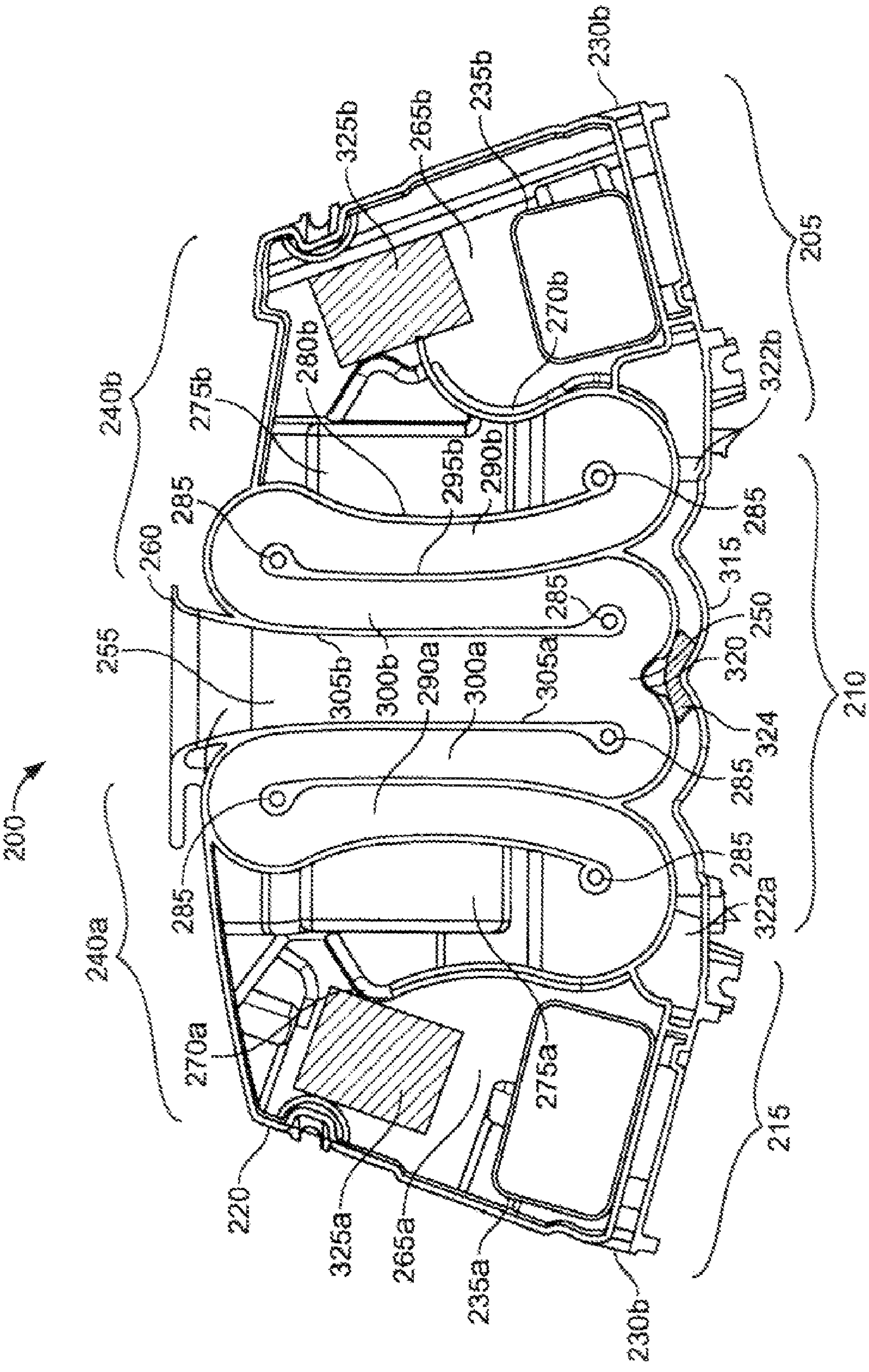
Figure 6C:
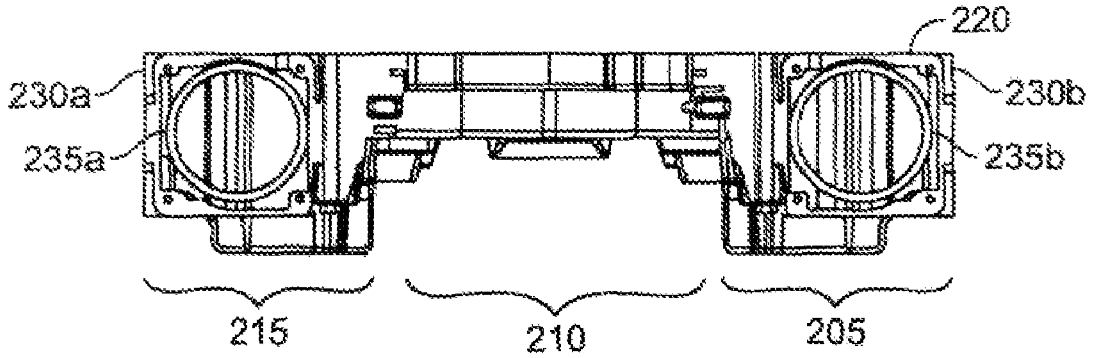
Figure 6D:
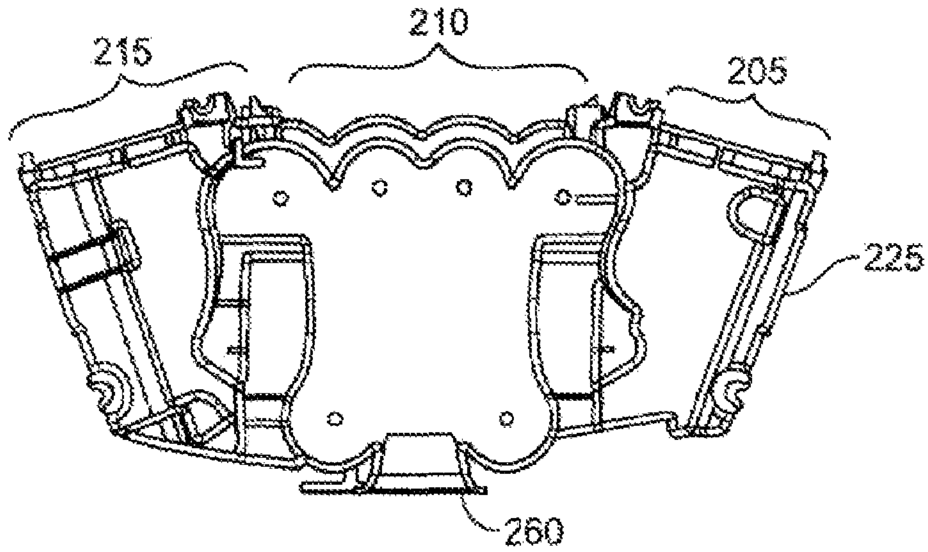
Figure 6E:
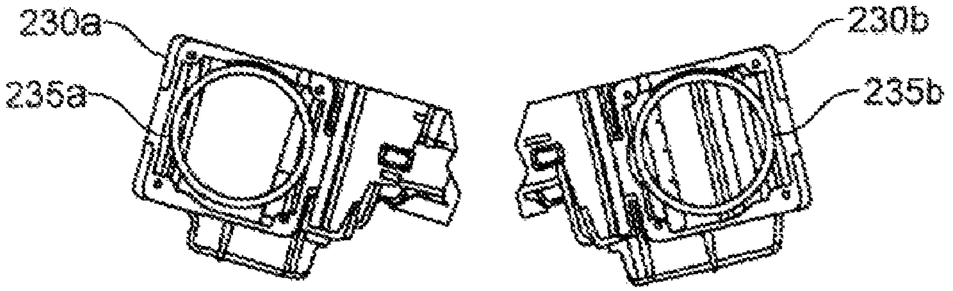

With specific reference to FIGS. 6A and 6B, the front of the waveguide includes a lateral channel 310 extending from an upper portion of the left driver frame 230*a* to an upper portion of the right driver frame 230*b*. The lateral channel is formed between a front portion of the second, third and fourth panels and a middle panel 315. Vent 320 proximate the branch junction 250 connects the center of the lateral channel 310 to the trunk section 255. The lateral channel 310 includes a left branch channel 322*a*, extending from the vent 320 to an upper portion of the left driver frame, and a right branch channel 322*b*, extending from the vent 320 to an upper portion of the right driver frame. The left and right branch channels 322*a*, 322*b* form acoustic structures, such as the elongate cavities depicted, that are sized and configured for reducing the magnitude of a resonance peak. The length of the elongate cavities are chosen to exhibit a resonance behavior in the frequency range where it is desired to control the magnitude of a resonance peak in the waveguide. The elongate cavity is designed such that the acoustic pressure due to the resonance in the elongate member, that is present at the location where the elongate member couples to the waveguide, destructively interferes with the acoustic pressure present within the waveguide, thus reducing the peak magnitude.

In one example, the center of the lateral channel 310 proximate the vent 320 contains resistive acoustical dampening material 324 such as polyester foam or fabric, for example, to help reduce this peak. The resonance peak in one example is 380 Hz. In one example, the length of the elongate member is chosen such that it is one quarter of the wavelength of the frequency of the resonance peak that it is desired to reduce. The cross-section area of the vent 320 can be as small as 25 percent of the cross-section area of the trunk.

Additionally, as shown, resistive acoustical dampening materials 325*a*, 325*b* can be placed behind each driver within first left and right subsections 265*a*, 265*b*, respectively, to damp out peaks at the higher frequencies (710 Hz-1.2 kHz in one example), but not affect the low frequencies as disclosed in the subject matter of U.S. Pat. No. 6,278,789. It should be noted that the location of the vent 250 and the cavities 322*a*, 322*b* are not limited to what has shown in FIGS. 6A and 6B. The location of the cavities can be anywhere along a general waveguide system corresponding to the pressure maximum of the target standing wave and the particular resonance peak to be attenuated. The use of such cavities for damping out a resonance peak is not limited to waveguides having common trunk and branch section configurations.

Referring now to FIG. 8A, a waveguide system includes a waveguide 330 having a trunk section 332 with a single open end 334 and two branch section 336*a*, 336*b* extending from the opposite end of the trunk section. Two cavities 338*a*, 338*b* are attached to the waveguide between the two branch sections at a vent 340. By establishing a vent 340 in the trunk, a target frequency component, 380 Hz in one example is significantly reduced. Resistive acoustical dampening materials 342 can be located proximate the vent 340 and/or in one or both of the cavities 338*a*, 338*b*. The cavities may also be located in the branch sections or bifurcated into multiple cavities for reducing multiple resonance peaks.

Referring now to FIGS. 8B and 8C, a waveguide system includes an acoustical waveguide 344 having a terminal end 346 and an open end 348. An electroacoustical driver 350 is coupled to the terminal end 346. The waveguide 344 is connected with a cavity 352 by a vent 353, or as shown in FIG. 8C, a bifurcated cavity having first and second subsections, 354*a*, 354*b*, commonly attached at vent 353 to the waveguide 344. In another example, the waveguide 344 leaks directly into the space outside the waveguide 344 (not shown). The vent 353 can have a cross-sectional area equal to or less than the cross-section area of the cavities. The cavities 352, 354*a*, 354*b* define a small volume as compared with the volume of the waveguide 344 and can include, for example, a resonance tube. Various other examples are disclosed in the subject matter of Bose patent application Ser. No. 10/699,304, filed Oct. 31, 2003. Acoustical dampening materials 356 (FIG. 8B) can be positioned proximate vent 353 and may fill a portion or substantially all of cavity 352 as indicated by dampening material 356'. Dampening material 358 (FIG. 8C) may fill a portion or substantially all of one or both cavities 354*a*, 354*b*, as indicated by dampening material 358'.

Referring to FIG. 9 and in one example, the waveguide 200 has dimensions as follows. The length $T_L$ of the trunk section 255 extending from the branch junction 250 to the trunk opening 260 is 4.8 in (122.4 mm) and the cross-sectional area $T_A$ of the trunk opening 260 is 2.5 sq. in. (1622 sq. mm). The length $L_L$ of the left subsection 240*a* of the waveguide from the start of the left subsection at the left frame 230*a* to the end of the left subsection proximate the branch junction 250 is 21.4 in (543.7 mm). The length $R_L$ of the right subsection 240*b* from the start of the right subsection at the right frame 230*b* to the end of the right subsection proximate the branch junction 250 is 21.0 in (535 mm). The cross-sectional area $LS_A$ at start of the left subsection is 7.9 sq. in (5134 sq. mm) and the cross-sectional area $RS_A$ at the start of the right subsection is 8.3 sq. in. (5396 sq. mm). The cross-sectional areas $LE_A$, $RE_A$ at the ends of the left subsection and right subsections, respectively, are 0.7 sq. in (448 sq. mm). Other dimensions wherein the waveguide lengths are related to the lowest frequency of operation and the cross-sectional areas are related to the −3 dB low frequency of the waveguide system, as described above, are contemplated.

As seen in FIGS. 10A and 10B, a radio 400 includes a housing 402 to enclose the waveguide system 200 (FIG. 5). In this example, the housing is substantially trapezoidal, approximating the overall shape of the waveguide. The radio 400 includes left and right openings 404*a*, 404*b*, corresponding to drivers 235*a* and 235*b* and a rear opening 406 generally proximate to the trunk opening 260. Thus, the radio is an example of an integrated audio system that, in this case, includes an audio source, two acoustic drivers, an acoustic device in the form of a split waveguide, and a housing that supports the source, drivers and device. A wide variety of other configurations of integrated audio systems are possible.

As shown in FIGS. 11 and 12 when the radio is being used, the drivers 235*a* and 235*b* face generally in the direction 600 toward a listening area 602 and the trunk opening 604 (an example of a sound opening of a waveguide) faces in the direction 606 of a space 608. The rear opening 406 in the housing (an example of an aperture) includes a number of vertical openings 609 (slots) and is separated from the trunk opening 604 by a space 610. Space 610 in this example is 32 mm, but could be larger or smaller depending on the design of the housing. Keeping the space small permits a compact design for the integrated audio system. But if the space is too small, the configuration of ribs 611 and the slots 609 that they separate may cause turbulence that distorts the sound as it is radiated from the rear opening 406. Thus, it is desirable to make the space large enough to reduce (or substantially eliminate) the distortion that would otherwise occur. The trunk opening 604 has a flare 605, which also contributes to reduction of turbulence in the sound that is radiated. Because the trunk opening faces the rear, the flare can be accommodated more easily than in the front wall where space is at a premium. The rear opening 406 can have a variety of configurations including a conventional metal or fabric grille, and other patterns of slots, holes, or other openings.

The trunk opening is oriented so that sound that is radiated from the trunk opening passes through the rear opening of the housing and into the space 608. Lower frequency components of the sound radiate omnidirectionally and reach the listening area where they combine with the sound radiated from the speakers. Higher frequency components of the sound radiated from the trunk opening, such as the higher frequency distortion components, tend to radiate directionally away from the listening area and are less audible.

The directions 600 and 606 are generally opposite in the example shown in FIG. 11. They are not exactly opposite because the front surface of the housing of the radio is curved; the drivers face directions 601 and 603 at small angles to the direction 600. In other examples, the directions 600 and 606 need not be opposite but could be, for example, at 90 degrees to one another, or a variety of other angles. In many examples, the direction 606 would not be into the listening area.

The techniques of (a) spacing the trunk end of the waveguide away from the rear end slots or grille of the housing and (b) facing the trunk end in a direction other than toward the listening area, can also be used with the open end of an acoustic port that is driven at its other end by a driver acting through air in a cabinet, for example.

Components 410 including a CD player and display, for example, are mounted generally along the middle portion 210 of the waveguide (FIG. 6A).

In operation, an audio circuit (e.g., an audio amplifier, or an audio amplifier combined with an audio source such as a radio or a CD player) drives two speakers (or other acoustic energy sources) that are mounted at the terminal ends of the two branch waveguide sections. The two speakers are driven by distinct audio program parts, for example, left and right channels of an audio source. The waveguides enhance the sound produced by the drivers and the smooth interior passages of the branch and trunk sections reduce turbulence and minimize acoustic reflections. Because the branch waveguide sections are spatially separated, the enhanced program parts are delivered separately to the listener. At the common trunk, the distinct program parts carried in the two branch sections can merge, and space can be saved because only a single trunk is required, without affecting the audio separation of the two program parts experienced by the user. Thus, the structure achieves the benefits of spatially separated waveguides with the space savings of a single trunk at the end away from the acoustic energy sources.

Other implementations are within the scope of the following claims.

What is claimed is:

1. An apparatus comprising an acoustic device, the apparatus comprising a trunk waveguide having a sound opening at a first end facing a space, an audio source, a first acoustic driver at a first end of a first branch waveguide, a second end of the first branch waveguide being connected to a second end of the trunk waveguide, the first acoustic driver facing a listening area, a second acoustic driver at a first end of a second branch waveguide, a second end of the second branch waveguide being connected to the second end of the trunk waveguide, and structure supporting the acoustic device, the audio source, and the acoustic drivers as an integrated audio system, the first acoustic driver and the opening of the waveguide facing in substantially different directions from the structure, the first and second acoustic drivers facing in substantially the same direction; and wherein lengths of the first and second branch waveguides are substantially the same.

2. The apparatus of claim 1 in which the first acoustic driver and the sound opening of the waveguide face in substantially opposite directions.

3. The apparatus of claim 1 in which the sound opening of the waveguide does not face the listening area.

4. The apparatus of claim 1 in which sound radiated by the open end of the waveguide has a different frequency spectrum from sound radiated from the acoustic drivers.

5. The apparatus of claim 1 in which the integrated audio system comprises a radio.

6. The apparatus of claim 1 in which opening at the end of the waveguide is flared.

7. An apparatus comprising an audio source, an acoustic driver supported by a housing and facing a listening area, an acoustic device comprising a waveguide having one end driven by the acoustic driver and a second, open end, and the housing supporting the audio source, the acoustic driver, and the acoustic device in an integrated audio system, the housing having an aperture facing in a direction different from the listening area, the aperture comprising two or more openings, the second, open end of the acoustic device being separated by a space from and facing the aperture of the housing and oriented with respect to the aperture so that sound radiated from the open end passes through the aperture.

8. The apparatus of claim 7 in which the aperture comprises a grille.

9. The apparatus of claim 7 in which the aperture comprises slots in the housing.

10. The apparatus of claim 7 in which the acoustic device comprises a folded waveguide.

11. The apparatus of claim 7 in which the space is at least large enough to substantially reduce distortion caused by the aperture of the housing in sound radiated from the acoustic device.

12. The apparatus of claim 7 in which the acoustic driver and the open end of the acoustic device face in substantially opposite directions.

13. The apparatus of claim 7 in which the open end of the acoustic device does not face the listening area.

14. The apparatus of claim 7 in which the acoustic device comprises a waveguide having a trunk and branches coupled to the trunk.

15. The apparatus of claim 14 in which each of the branches has a corresponding acoustic driver.

16. The apparatus of claim 7 in which sound radiated by the open end of the acoustic device has a different frequency spectrum from sound radiated by the acoustic driver.

17. The apparatus of claim 7 in which the integrated audio system comprises a radio.

18. An apparatus comprising an audio source, an acoustic driver facing a listening area, a housing supporting the audio source and the acoustic driver in an integrated audio system, the housing comprising an aperture, the aperture comprising two or more openings, an acoustic device comprising a waveguide having one end driven by the acoustic driver and a second, open end, the second, open end of the acoustic device being separated by a space from and facing the aperture of the housing and oriented with respect to the aperture so that sound radiated from the open end passes through the aperture.

19. The apparatus of claim 7 or 18 in which the second, open end of the acoustic device is flared.

20. The apparatus of claim 18 in which the aperture comprises a grille.

21. The apparatus of claim 18 in which the aperture comprises slots in the housing.

22. The apparatus of claim 18 in which the acoustic device comprises a folded waveguide.

23. The apparatus of claim 18 in which the space is at least large enough to substantially reduce distortion caused by the aperture of the housing in sound radiated from the acoustic device.

24. The apparatus of claim 18 in which the acoustic driver and the open end of the acoustic device face in substantially opposite directions.

25. The apparatus of claim 18 in which the open end of the acoustic device does not face the listening area.

26. The apparatus of claim 18 in which the acoustic device comprises a waveguide having a trunk and branches coupled to the trunk.

27. The apparatus of claim 26 in which each of the branches has a corresponding acoustic driver.

28. The apparatus of claim 18 in which sound radiated by the open end of the acoustic device has a different frequency spectrum from the sound radiated by the acoustic driver.

29. The apparatus of claim 18 in which the apparatus comprises a radio.

* * * * *

UNITED STATES PATENT AND TRADEMARK OFFICE

CERTIFICATE OF CORRECTION

PATENT NO. : 7,584,820 B2
APPLICATION NO. : 10/914497
DATED : September 8, 2009
INVENTOR(S) : Parker et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 236 days.

Signed and Sealed this

Fourteenth Day of September, 2010

David J. Kappos
*Director of the United States Patent and Trademark Office*